United States Patent [19]
Wennekers

[11] Patent Number: 5,804,849
[45] Date of Patent: Sep. 8, 1998

[54] COMPOUND SEMICONDUCTOR DEVICE AND METHOD OF MANUFACTURE

[75] Inventor: Peter Wennekers, Tempe, Ariz.

[73] Assignee: Motorola, Inc., Schaumburg, Ill.

[21] Appl. No.: 645,378

[22] Filed: May 13, 1996

[51] Int. Cl.$^6$ .......................... H01L 29/80; H01L 31/112
[52] U.S. Cl. .......................... 257/280; 257/472; 257/476; 257/484; 438/167
[58] Field of Search ..................... 257/280, 472, 257/476, 484; 438/167

[56] References Cited

U.S. PATENT DOCUMENTS

| | | | |
|---|---|---|---|
| 4,054,895 | 10/1977 | Ham | 357/23 |
| 4,633,282 | 12/1986 | Lee | 357/22 |
| 5,124,770 | 6/1992 | Umemoto et al. | 257/280 |
| 5,306,650 | 4/1994 | O'Mara, Jr. et al. | 437/39 |
| 5,572,048 | 11/1996 | Sugawara | 257/132 |

*Primary Examiner*—Sara W. Crane
*Attorney, Agent, or Firm*—Rennie William Dover

[57] ABSTRACT

A MESFET structure (20) and a method that minimizes the effects of processing steps and device performance of the MESFET structure (20). The MESFET structure (20) has a gate (30) positioned over a channel region (28) and between a source region (36) and a drain region (34). The MESFET structure (20) further includes a hole injector region (32) formed near the channel region (28). The hole injector region (32) injects holes beneath the channel region (28) which decrease the ability of the trap sites to attract electrons generated by impact ionization. Thus, this supply of holes beneath the channel region (28) prevents the effects of IV-kink and hysteresis caused by electrons that are accumulated in the trap sites.

20 Claims, 2 Drawing Sheets

COMPOUND SEMICONDUCTOR DEVICE AND METHOD OF MANUFACTURE

BACKGROUND OF THE INVENTION

The present invention relates, in general, to integrated circuit devices and, more particularly, to the output conductance of Field Effect Transistors (FETs).

Imperfections within a semiconductor substrate can disrupt the perfect periodicity of the crystal lattice and result in intermediate energy levels within the forbidden energy gap. The intermediate energy levels or traps caused by imperfections enhance the likelihood of transitions of electrons and holes between the conduction and valence bands. Thus, imperfections can make energy transitions more probable and exert influence on the conduction of currents within a semiconductor.

A Metal Semiconductor Field Effect Transistor (MESFET) in a Gallium Arsenide (GaAs) process can undergo multiple ion-implantation steps during the deposition of P-type and N-type impurity material for forming well regions, source regions, and drain regions. Since the ion-implantation process includes accelerating ions to the substrate surface, some lattice damage occurs and trap sites are formed. These effects alter the threshold voltage and increase the output conductance of GaAs devices. An excessive output conductance in a MESFET device is undesirable.

The gain of a MESFET device is the ratio of transconductance to the output conductance, wherein the transconductance represents a change in drain current at a given drain voltage in response to a change in the gate-source voltage. The output conductance is the ratio of the change in the drain current to a change in the drain voltage at a given gate to source voltage. The output conductance of a MESFET operating at a higher drain voltage increases in accordance with trap levels in the bandgap of the ion-implanted GaAs substrates. MESFET devices processed by ion-implantation techniques exhibit high trap densities which give rise to IV-kinks, i.e., sudden increases of device output conductance at a high drain-source voltage.

Another adverse effect of high trap density is slowing down the device response time at cold temperatures, causing a drain current hysteresis phenomena.

Accordingly, it would be advantageous to have a MESFET device in which the MESFET output conductance is unaffected by the drain-to-source current IV-kink irregularities. It would be of further advantage for the FET devices to be insensitive to current hysteresis effects due to low temperatures and IV-transients.

DETAILED DESCRIPTION OF THE DRAWINGS

Figure 1:
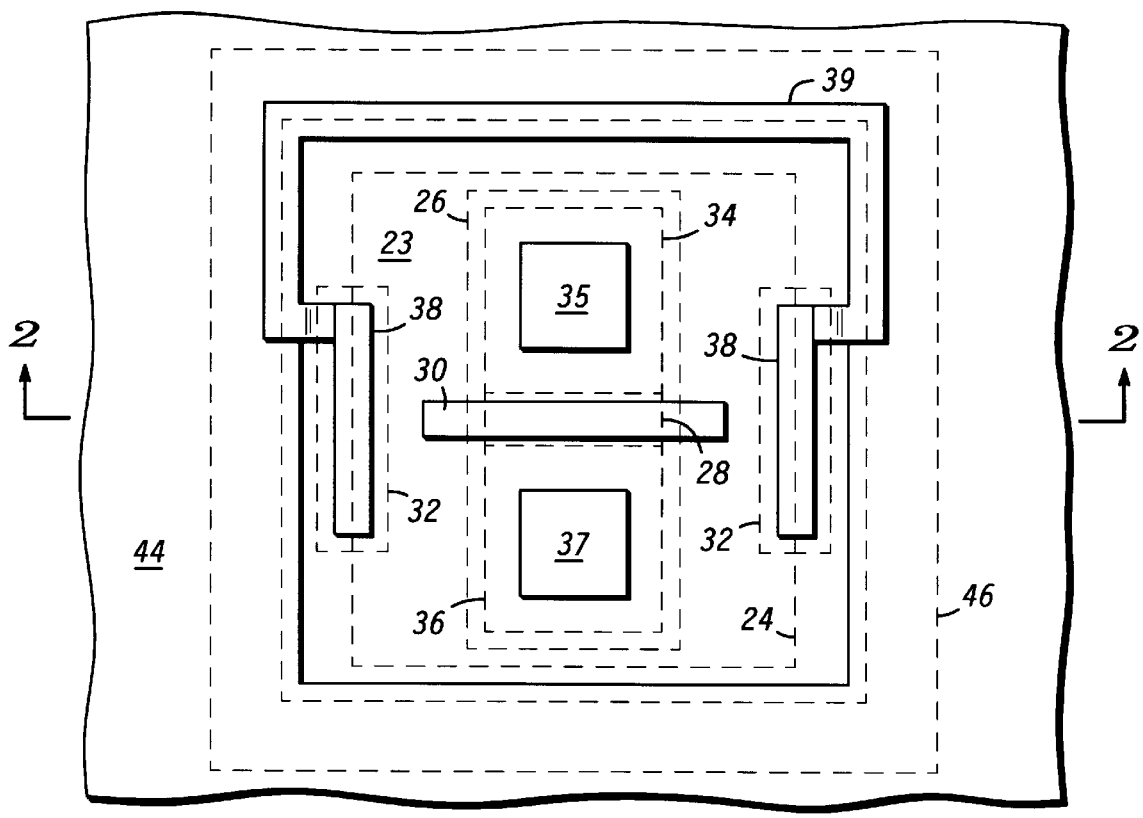
FIG. 1 is a top view of a MESFET structure in accordance with a first embodiment of the present invention.

FIG. 1 is a top view of a MESFET structure 20 in accordance with a first embodiment of the present invention. MESFET structure 20 is a compound semiconductor device that includes a P-type region 24, a P-well region 26 having a higher conductivity than region 24, a N-channel region 28, a drain region 34, a source region 36, and an isolation implantation ring 46. MESFET structure 20 further includes a gate 30, a source electrode 37, a drain electrode 35, and a hole injector electrode 38. In accordance with the first embodiment, source and drain electrodes 37 and 35, respectively, are on opposing sides of gate 30. In other words, gate 30 is between source electrode 37 and drain electrode 35. Hole injector regions 32 are adjacent to and spaced apart from N-channel region 28 by about two to ten microns. Each hole injector electrode 38 makes an ohmic contact to hole injector region 32. Metal interconnect 39 commonly couples multiple placements of hole injector electrode 38. It should be understood that a single placement of injector region 32 and hole injector electrode 38 are not intended as a limitation of the present invention.

Figure 2:
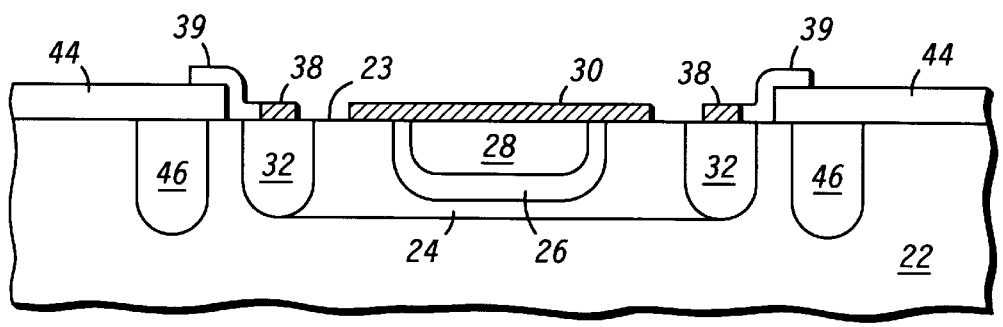
FIG. 2 is an enlarged cross-sectional view of the MESFET structure along section line 2—2 of FIG. 1.

Referring now to FIG. 2, an enlarged cross-sectional view of MESFET structure 20 along section line 2—2 of FIG. 1 is shown. By way of example, MESFET structure 20 is a N-channel semiconductor device formed in a compound semiconductor substrate 22. Suitable materials for compound semiconductor substrate 22 include gallium arsenide, indium phosphide, or the like. Although MESFET structure 20 will be described as a N-channel semiconductor device, this is not intended as a limitation of the present invention and as those skilled in the art will appreciate, a P-channel semiconductor device may be achieved by converting P-type regions to N-type regions and vice versa.

More particularly, FIG. 2 illustrates semiconductor substrate 22 having a P-well region 26 and a hole injector region 32 adjacent to and spaced apart from P-well region 26. FIG. 2 further illustrates a gate 30 formed over P-well region 26 and N-type doped channel region 28. Metal electrode 38 is formed over hole injector region 32. A portion of P-well region 26 below gate 30 encloses a N-type doped channel region 28. P-type hole injector region 32 is coupled to P-well region 26 through P-type region 24. Implantation ring 46 encloses source region 36, drain region 34, gate 30, well region 26 and hole injector region 32 and is spaced apart from hole injector region 32. Implantation ring 46 is implanted with dopant materials such as hydrogen, boron, or oxygen and provides the isolation for multiple MESFETs operating on an integrated circuit structure. Optionally, a discrete MESFET device is manufactured with or without implantation ring 46.

A MESFET 20 of FIG. 1 is a four terminal device having a gate 30, a drain region 34, a source region 36, and a well region 26 of a conductivity type material such as P-type. In accordance with the present invention, drain region 34 of the MESFET device is formed from a N-type dopant, contained within a first portion of P-well region 26 and bounded laterally by gate 30. Source region 36 of the MESFET device is also formed from a N-type dopant, contained within a second portion of P-well region 26 and located on an opposite side of gate 30 with reference to drain region 34. Alternatively, the MESFET comprises a gate 30 bordered by spacer isolation structures (not shown) to pattern source region 36 and drain region 34.

In operation, a first voltage applied from drain region 34 to source region 36 and a second voltage applied across gate 30 to source region 36 provides electrons traveling through a channel region beneath gate 30 from source region 36 to a drain region 34. The first voltage ranges from about 0.5 volt to about twenty volts. With a N-channel depletion MESFET device, the voltage applied across gate 30 to source region 36 can be a positive value, a negative value, or the same voltage as source region 36 for device operation. This current flow is controlled by a depletion region. The voltage between drain region 34 and source region 36 (Vds) accelerates electrons towards drain region 34. Electrons traveling in the high field region near drain region 34 may gain enough kinetic energy to generate electron-hole pairs due to scattering processes. Electrons generated from the electron-hole pairs will be swept into drain region 34 and the holes will drift into P-well region 26.

When the MESFET device is operated at low drain-to-source voltages (Vds), trap sites caused by imperfections are empty. With an increase in voltage Vds, an electric field in accordance with the Vds voltage pulls electrons from source region 36 to drain region 34. The higher kinetic energy of electrons approaching drain region 34 results in electron impact ionization. In highly doped regions such as beneath gate 30, electrons become excited and move from the valence band to the conduction band. Thus, electrons and holes are generated in the high field region between gate 30 and drain region 34. The increased number of electrons from impact ionization are swept to drain region 34 while the increase in the positive hole charge accumulates in the P-well region 26 region beneath the channel region 28. The electrons are scattered as they are swept to the drain region and fill the trap sites.

With a decreasing drain-to-source voltage Vds the hysteresis effect becomes pronounced. Lowering the Vds voltage reduces the generation of additional electrons from impact ionization. The electrons filling trap sites prevent electrons attempting to move from the MESFET source region 36 to the drain region 34. Thus the drain-to-source current Ids or the conduction of the MESFET device is reduced. With time, such as milliseconds or seconds depending on the temperature, trapped electron charge is released. As the Vds voltage is increased, impact ionization again generates electron-hole pairs and the Ids hysteresis is repeated. Thus, MESFET devices have a temperature dependent hysteresis that affects conduction currents as the devices are switched on and off.

The hole injector region 32 is of P-type conductivity material and is coupled to P-well region 26 by a lightly doped, low conductivity P-type region 24. A higher voltage or a more positive voltage than the source voltage is applied to metal electrode 38 with ohmic contact to hole injector region 32. Hole injector region 32 has been added to MESFET structure 20 to stabilize the available holes beneath gate 30 and drain region 34. When impact ionization generates electron-hole pairs, holes are again accumulated in the P-well region 26 beneath the channel region 28. Hole injector region 32 supplies numerous holes, thus the impact ionization generated holes have a negligible effect on the net positive charge accumulated in P-well region 26.

P-type hole injector region 32 acts as a forward biased PN-junction (P-type material and N-type material) or diode when its voltage is greater than that of N-type MESFET source region 36 and supplies a stabilizing positive charge to P-well region 26. The positive charge in P-well region 26 attracts electrons and thereby maintains a wide conduction channel between source region 36 and drain region 34. Thus, the high concentration of holes in P-well region 26 beneath the conduction channel compensates for the number of trap sites being filled with electrons. Thus the effect of trap sites is minimized.

It should be understood that the material property of the substrate renders its conductivity type unknown or of N-type conductivity. Thus region 24 may be intentionally doped with an impurity material of P-type conductivity to ensure that it is a P-type region. In a beginning step for the manufacture of MESFET structure 20, a first masking layer (not shown) such as photoresist, is formed on major surface 23 of substrate 22 and is patterned to expose the portion of substrate 22 where P-type region 24 will be formed. Methods for forming P-type region 24 are known in the art. By way of example, region 24 is doped with an impurity to achieve a P-type conductivity. P-type region 24 extends from major surface 23 into semiconductor substrate 22. It should be understood that including region 24 is optional. The masking layer is then removed to allow further processing. When the starting material is of P-type conductivity or will become P-type during a processing annealing step, region 24 is created in substrate 22.

A second masking layer (not shown) is formed on major surface 23 and is patterned to expose the portion of substrate 22 where a P-well region 26 will be formed. Methods for forming P-well region 26 are known in the art. By way of example, P-well region 26 is formed by implanting substrate 22 with beryllium at a dose of $2 \times 10^{12}$ to $4 \times 10^{12}$ atoms/square centimeters (atoms/cm$^2$) and an energy of about 120 kilo-electron volts (keV) to 170 keV. The masking layer is then removed to allow further processing.

A third masking layer (not shown) is formed on major surface 23 and is patterned to expose the portion of substrate 22 where channel region 28 will be formed. Channel region 28 extends from major surface 23 into P-well region 26 and is formed by implanting, for example, silicon into semiconductor substrate 22 using a dose of $2 \times 10^{12}$ to $5 \times 10^{12}$ atoms/cm$^2$ and an energy of about 60 to 100 keV. The third masking layer is then removed to allow further processing.

A metal layer for a gate region such as gate 30 is formed on major surface 23. Suitable materials for the metal layer include metals or compounds such as titanium (Ti), titanium tungsten (TiW), titanium tungsten nitride (TiWN), platinum (Pt), or other refractory metal compounds capable of forming a Schottky contact. The metal is deposited at a thickness of approximately 3000 angstroms to 5000 angstroms. A fourth masking layer (not shown) is formed on major surface 23 and is patterned to expose the portion of substrate 22 where gate 30 will be formed. Gate 30 forms a Schottky contact to substrate 22. Gate 30 is formed on major surface 23 by removing the exposed portions of the metal layer and leaving the portion of the metal layer that serves as gate 30. Dielectric spacer regions (not shown) of approximately 0.3 micron may be formed adjacent to both sides of gate 30. Dielectric spacer regions (not shown) are an alternative step and not intended as a limitation of the invention. The masking layer is then removed to allow further processing.

A fifth masking layer (not shown) is formed on major surface 23 and is patterned to expose the portion of substrate 22 where source region 36 and drain region 34 will be formed. Source region 36 and drain region 34 are of N-type conductivity and are formed by implanting a N-type dopant such as silicon, selenium, or tellurium. By way of example, source and drain regions 36 and 34, respectively, are formed by implanting the dopant at a dose of about $5.0 \times 10^{12}$ to $5.0 \times 10^{13}$ atoms/cm$^2$ and an implant energy of about 70 to 130 keV. It should be noted that source region 36 and drain region 34 are each a doped region that extend into N-type doped channel region 28, P-well region 26 and substrate 22. The masking layer is then removed to allow further processing.

A masking layer (not shown) is formed on major surface 23 and is patterned to expose the portion of substrate 22 where hole injector region 32 will be formed. The P-type hole injector region 32 is formed by implanting a P-type dopant such as beryllium, zinc, magnesium, or the like into substrate 22. P-type hole injector region 32 is also referred to as a hole injector region or an injector region. By way of example, hole injector region 32 is formed by implanting beryllium into substrate 22 at a dose of about $5.0 \times 10^{14}$ to $5.0 \times 10^{15}$ atoms/cm$^2$ and an implant energy of about 50 to 100 keV. The masking layer is then removed to allow further processing.

Using techniques well known in the art, a metal electrode 37 is formed over source region 36, a metal electrode 35 is formed over drain region 34, and a metal electrode 38 is formed over hole injector region 32. In the preferred embodiment, the metalized electrodes 37, 35, and 38 form ohmic contacts to the source region 36, drain region 34, and hole injector region 32, respectively. Dielectric layer 44 is disposed on the top of semiconductor major surface 23. Openings are etched into dielectric layer 44 such that metal interconnect 39 is on dielectric layer 44 and couples multiple metal electrodes 38.

Figure 3:
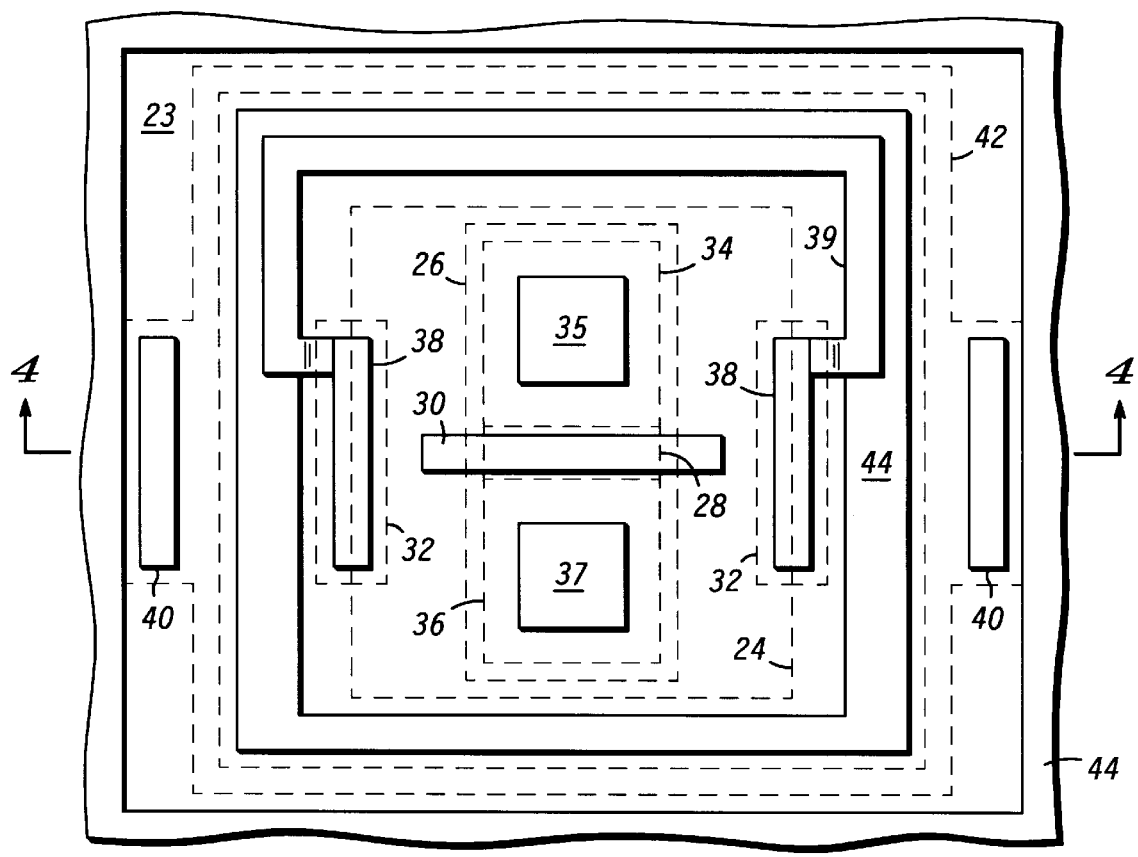
FIG. 3 is a top view of a MESFET structure that includes guard ring protection according to an embodiment of the present invention.

Now referring to FIG. 3, a second embodiment of a MESFET structure 48 is shown. MESFET structure 48 includes guard ring protection for the MESFET device with guard ring electrode 40 making ohmic contact to implant guard ring region 42. MESFET structure 48 includes a P-type region 24, a P-well region 26, a N-channel region 28, a drain region 34, a source region 36, and a N-type guard ring region 42. MESFET structure 48 further includes a gate 30, a source electrode 37, a drain electrode 35, a hole injector electrode 38, and a guard ring electrode 40. In accordance with the second embodiment, source and drain electrodes 37 and 35, respectively, are on opposing sides of gate 30. In other words, gate 30 is between source electrode 37 and drain electrode 35. Hole injector regions 32 are adjacent to and spaced apart from source and drain electrodes 37 and 35, respectively. Hole injector regions 32 are commonly coupled by means of hole injector electrode 38. It should be understood that the same reference numbers are used in the figures to denote the same elements.

Figure 4:
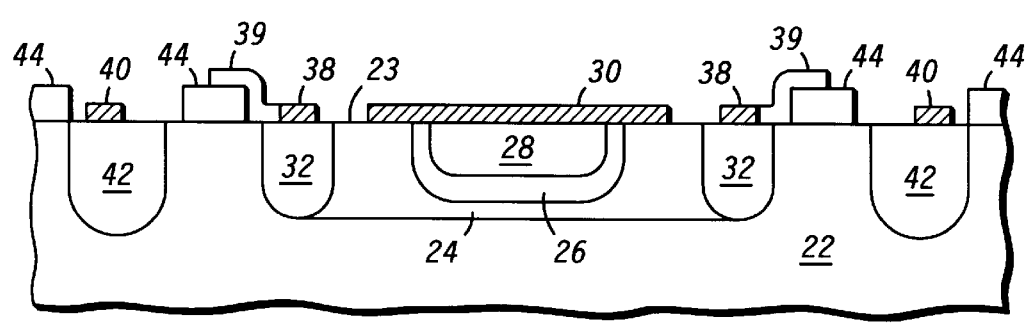
FIG. 4 is an enlarged cross-sectional view of the MESFET structure along section line 4—4 of FIG. 3.

Referring now to FIG. 4, an enlarged cross-sectional view of MESFET structure 48 along section line 4—4 of FIG. 3 is shown. By way of example, MESFET structure 48 is a N-channel semiconductor device formed in a compound semiconductor substrate 22. Suitable materials for compound semiconductor substrate 22 include gallium arsenide and indium phosphide. Although MESFET structure 48 will be described as a N-channel semiconductor device, this is not intended as a limitation and as those skilled in the art will appreciate, a P-channel semiconductor device is achieved by converting P-type regions to N-type regions and vice versa.

More particularly, FIG. 4 illustrates semiconductor substrate 22 having a P-well region 26 and a hole injector region 32 with the hole injector region 32 adjacent to and spaced apart from P-well region 26. In addition, N-type guard ring region 42 surrounds and is spaced apart from P-well region 26, source region 36, drain region 34, and hole injector region 32. FIG. 4 further illustrates a gate 30 formed over N-type doped channel region 28 and P-well region 26. Metal electrode 38 is formed over hole injector region 32 and metal electrode 40 is formed over guard ring region 42. A portion of P-well region 26 below gate 30 encloses a N-type doped channel region 28.

Implant guard ring region 42 is a N-type material disposed in substrate 22. A metal electrode 40 forms an ohmic contact with implant guard ring region 42. Metal electrode 40 is connected to the highest system operating voltage. The P-type hole injector region 32 is coupled to P-well region 26 by a lightly doped, highly resistive P-type region 24. MESFET structure 48 is confined by the implant guard ring region 42. Dielectric layer 44 is disposed on the top of semiconductor major surface 23. Openings are etched into dielectric layer 44 such that metal interconnect 39 is on dielectric layer 44 and couples multiple metal electrodes 38.

In addition to the processing steps described with reference to FIGS. 1 and 2, a sixth masking layer (not shown) is formed on major surface 23 and patterned to expose the portion of substrate 22 where guard ring region 42 will be formed. Implant guard ring region 42 provides isolation protection and is a N-type material formed in substrate 22. The sixth masking layer is then removed to allow further processing.

Following the processing step for patterning and forming guard ring region 42, a masking layer (not shown) is formed on major surface 23 and patterned to expose the portion of substrate 22 where hole injector region 32 will be formed. The P-type hole injector region 32 is formed with a dopant such as beryllium, zinc, magnesium, or the like. The masking layer is then removed to allow further processing. Again, a metal electrode 37 is formed over source region 36, a metal electrode 35 is formed over drain region 34, a metal electrode 38 is formed over hole injector region 32, and a metal electrode 40 is formed over guard ring region 42. In this embodiment the metalized electrodes 37, 35, 38, and 40 form ohmic contacts to the source region 36, drain region 34, hole injector region 32, and guard ring region 42, respectively.

As described with reference to FIGS. 3 and 4, hole injector region 32, of a P-type material, provides holes for compensating bandgap trap sites in the MESFET device. A metal electrode 38 on substrate 22 forms an ohmic contact with a hole injector region 32 and provides a terminal for a positive supply voltage. Preferably, implant guard ring region 42 provides isolation protection by defining the region for disposing a N-type material into substrate 22. A metal electrode 40 forms an ohmic contact with implant guard ring region 42.

It should be understood that when MESFET structures 20 and 48 are fabricated as shown in FIGS. 1–4, i.e., with or without guard ring region 42 or isolation implantation ring 46, the MESFET may be manufactured as a discrete device. The addition of implant guard ring region 42 (see FIGS. 3 and 4) to surround MESFET structure 48 or isolation implantation ring 46 (see FIGS. 1 and 2) to surround MESFET structure 20 provides isolation protection such that multiple MESFET devices can be fabricated as an integrated circuit.

By now it should be appreciated that the present invention provides MESFET structures 20 and 48 such that existing traps have minimal effects. A hole injector region 32 is formed near the channel region of MESFET gate 30 such that holes decrease the number of trap sites accumulating electrons generated by impact ionization. This supply of holes beneath the current conduction channel prevents the effects of IV-kink and hysteresis caused by electrons located in trap sites.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, doping can be accomplished by diffusion rather than by ion-implantation. Also, the embodiments as shown in FIGS. 2 and 4 provide a hole injector region 32 on both sides of gate 30 and positioned perpendicular to the ends of gate 30 at about five microns from N-type channel region 28. Other embodiments include only one hole injector region 32 or a continuous "U" shaped hole injector region 32 surrounding the three sides of the drain region. The placement or shape of hole injector region 32 is not intended as a limitation of the present invention.

What is claimed is:

1. A compound semiconductor device, comprising:

a compound semiconductor substrate having a major surface;

a well region of a first conductivity type material disposed in the compound semiconductor substrate;

a first doped region of a second conductivity type material disposed in the well region;

a second doped region of the second conductivity type material disposed in the well region, the second doped region spaced apart from the first doped region;

a third doped region of the second conductivity type material disposed between the first doped region and the second doped region, the third doped region serving as a channel region;

a fourth doped region of a first conductivity type material disposed in the compound semiconductor substrate, the fourth doped region spaced apart from the well region;

a Schottky contact to the third doped region;

a first ohmic contact to the first doped region;

a second ohmic contact to the second doped region; and a third ohmic contact to the fourth doped region.

2. The compound semiconductor device of claim 1 wherein the well region is a P-type material.

3. The compound semiconductor device of claim 2 further comprising a first voltage coupled between the third ohmic contact and the first ohmic contact, wherein the third ohmic contact is at a higher voltage relative to the first ohmic contact.

4. The compound semiconductor device of claim 3 wherein the first voltage ranges from about 0.5 volt to about twenty volts.

5. The compound semiconductor device of claim 4 further comprising a second voltage coupled between the second ohmic contact and the first ohmic contact, wherein the second ohmic contact is at a higher voltage relative to the first ohmic contact.

6. The compound semiconductor device of claim 5 further comprising a third voltage coupled between the Schottky contact and the first ohmic contact, wherein the Schottky contact is at a different voltage relative to the first ohmic contact.

7. The compound semiconductor device of claim 6 wherein the fourth doped region is coupled to the well region, the fourth doped region is of P-type conductivity material and provides holes for the well region.

8. A method of suppressing hysteresis in a semiconductor device, comprising the steps of:

providing the semiconductor device, wherein the semiconductor device has a P-well region, a source region, a drain region, a channel region, a gate region, and a hole injector region; and injecting holes from the hole injector region into the P-well region, wherein the holes suppress hysteresis.

9. The method of claim 8 wherein the semiconductor device further comprises coupling the hole injector region to the P-well region, and wherein both the hole injector region and the P-well region are of a P-type conductivity.

10. The method of claim 9 wherein the step of injecting holes from the hole injector region into the P-well region includes placing a first voltage between the hole injector region and the source region.

11. The method of claim 10 wherein placing a first voltage between the hole injector region and the source region includes forward biasing of a PN-junction, wherein the hole injector region is at a higher voltage with respect to the source region.

12. The method of claim 11 wherein the step of injecting holes from the hole injector region into the P-well region is accumulating holes in the P-well region beneath the gate region.

13. A method for manufacturing a device in a compound semiconductor, comprising the step of:

providing a semiconductor substrate having a major surface;

providing a well region of a first conductivity type material disposed into the semiconductor substrate;

providing a channel region of a second conductivity type material disposed into the well region;

providing a gate onto the major surface of the semiconductor substrate;

providing a source region and a drain region of a second conductivity type material disposed into the channel region; and forming a hole injector region of a first conductivity type material coupled to the well region.

14. The method of claim 13, wherein the well region is a P-type material.

15. The method of claim 14, wherein the step of forming a hole injector region includes implanting a P-type conductivity material into the semiconductor substrate.

16. The method of claim 14, wherein the step of forming a hole injector region includes diffusing a P-type conductivity material into the semiconductor substrate.

17. The method of claim 14, wherein the step of forming a hole injector region includes disposing a P-type conductivity material into the semiconductor substrate spaced apart from the well region.

18. The method of claim 14, wherein the method for manufacturing a device in a compound semiconductor further includes the step of providing a P-type region for coupling the hole injector region to the well region.

19. The method of claim 14, wherein the method for manufacturing a device in a compound semiconductor further includes the step of providing an isolation implantation ring.

20. The method of claim 14, wherein the method for manufacturing a device in a compound semiconductor further includes the step of providing a N-type guard ring.

* * * * *